US006885962B2

(12) United States Patent
Yamashita (10) Patent No.: US 6,885,962 B2
(45) Date of Patent: Apr. 26, 2005

(54) SIGNAL INSPECTION DEVICE (75) Inventor: Tomitaka Yamashita, Shuuchi-gun (JP)

(73) Assignee: Kabushiki Kaisha Moric, Mori-machi (JP)

( * ) Notice: Subject to any disclaimer, the term of this patent is extended or adjusted under 35 U.S.C. 154(b) by 28 days.

(21) Appl. No.: 09/683,822

(22) Filed: Feb. 20, 2002

(65) Prior Publication Data

US 2002/0116142 A1 Aug. 22, 2002

(30) Foreign Application Priority Data

Feb. 21, 2001 (JP) ........................................ 2001-045819

(51) Int. Cl.[7] .............................................. G01R 31/00
(52) U.S. Cl. ..................................... 702/120; 714/724
(58) Field of Search ............................. 702/57, 63–67, 702/80, 118–124, 177, 183, 184, 189, 190; 714/45, 724, 725, 736; 455/573

(56) References Cited

U.S. PATENT DOCUMENTS 4,291,404 A * 9/1981 Steiner ........................ 714/724
4,771,399 A * 9/1988 Snowden et al. ............ 365/226
4,788,708 A * 11/1988 Hendrix .................... 379/22.02
4,868,376 A * 9/1989 Lessin et al. ................ 235/492
5,157,782 A * 10/1992 Tuttle et al. ................... 714/45
5,327,350 A * 7/1994 Endo .......................... 700/179
5,572,444 A * 11/1996 Lentz et al. ................. 702/117
5,771,474 A * 6/1998 Matt et al. ..................... 701/29
5,943,201 A * 8/1999 Walker et al. ................. 361/64
5,963,249 A * 10/1999 Kim ........................... 348/178
6,073,085 A * 6/2000 Wiley et al. ................. 702/118
6,076,177 A * 6/2000 Fontenot et al. ............. 714/724
6,195,772 B1 * 2/2001 Mielke et al. ............... 714/724
6,314,307 B1 * 11/2001 Charron ...................... 455/573
6,324,665 B1 * 11/2001 Fay ............................ 714/736

* cited by examiner

Primary Examiner—Hal Wachsman
Assistant Examiner—Mohamed Charioui
(74) Attorney, Agent, or Firm—Ernest A Beutler (57) ABSTRACT An inspection process and method that is performed not by the operation of a PC but within the inspection device itself according to the inspection program stored in a memory circuit in the inspection device. Therefore, the inspection is performed without being affected by the performance of a PC with constant stability and reliability.

2 Claims, 7 Drawing Sheets

5DS-00 — Inspection item choice — Cancel — OK

Inspection items (58):

| | |
|---|---|
| 01 | Diode check |
| 02 | Wire check |
| 03 | Ignition check |
| 04 | Misfire check |
| 05 | YCLS check! |
| 06 | Initial check |
| 07 | Discharge |
| 08 | Capacitor check |
| 09 | Resistor check |
| 10 | Circuit check |

Choice items — Inspection steps (59) — Comments — Details (61)

| SKIP | # | Inspection steps | Comments |
|---|---|---|---|
| ☐ | 01 | Diode check | Between D2 1V |
| ☐ | 02 | Diode check | Between D10 1V |
| ☐ | 03 | Diode check | Between D3 1V |
| ☐ | 04 | Diode check | Between D4 1V |
| ☐ | 05 | Diode check | Between D8 1V |
| ☐ | 06 | Capacitor check | Charging capacitor |
| ☐ | 07 | Circuit check | Vcc voltage |
| ☐ | 08 | 電源クランプチェック | Clamp Lo-1 |
| ☐ | 09 | 電源クランプチェック | Clamp Hi-1 |
| ☐ | 10 | Auto-choke check | Output voltage |
| ☐ | 11 | Side stand check | Side stand |
| ☐ | 12 | CPU port check | CPU port |
| ☐ | 13 | Trigger start check | 500rpm |
| ☐ | 14 | Initial check | 1500rpm |
| ☐ | 15 | Ignition check | 6000rpm |
| ☐ | 16 | STOP check | STOP |
| ☐ | 17 | Discharge short | Short |
| ☐ | 18 | | |
| ☐ | 19 | | |
| ☐ | 20 | | | lective flake

Power supply clamp check

Item editing — Insert before ☐
STEP [1] — Delete

| # | Inspection item | Inspection<br>Non-inspection | Measurement<br>break revolution | Work<br>power supply | Charge | Pulser | Pulserlevel | TPS | vehicle speed | Comparator level<br>vehicle speed | Trigger 1 |
|---|---|---|---|---|---|---|---|---|---|---|---|
| 1 | Diode check | TRUE | FALSE | 0 | 1 | NONE | NONE | 0 | 0 | 0 | 0 | 0 |
| 2 | Diode check | TRUE | FALSE | 0 | 1 | NONE | NONE | 0 | 0 | 0 | 0 | 0 |
| 3 | Diode check | TRUE | FALSE | 0 | 1 | NONE | NONE | 0 | 0 | 0 | 0 | 0 |
| 4 | Diode check | TRUE | FALSE | 0 | 1 | NONE | NONE | 0 | 0 | 0 | 0 | 0 |
| 5 | Diode check | TRUE | FALSE | 0 | 1 | NONE | NONE | 0 | 0 | 0 | 0 | 0 |
| 6 | Capacitor check | TRUE | FALSE | 0 | 0 | NONE | NONE | 0 | 0 | 0 | 0 | 0 |
| 7 | Circuit check | TRUE | FALSE | 0 | 14 | NONE | NONE | 0 | 0 | 0 | 0 | 0 |
| 8 | Power supply clamp check | TRUE | FALSE | 0 | 21 | NONE | NONE | 0 | 0 | 0 | 0 | 0 |
| 9 | Power supply clamp check | TRUE | FALSE | 0 | 27 | NONE | NONE | 0 | 0 | 0 | 0 | 0 |
| 10 | Auto-choke check | TRUE | FALSE | 0 | 14 | NONE | NONE | 0 | 0 | 0 | 0 | 0 |
| 11 | Side stand check | TRUE | FALSE | 0 | 14 | DC | NONE | 0 | 0 | 0 | 0 | 0 |
| 12 | CPU port check | TRUE | FALSE | 0 | 14 | NONE | NONE | 0 | 0 | 0 | 0 | 0 |
| 13 | Trigger start check | TRUE | FALSE | 500 | 14 | ch_60 | pu_pos60 | 5 | 0 | 3 | 20 | 30 |
| 14 | Initial check | TRUE | FALSE | 1500 | 14 | ch_60 | pu_pos60 | 20 | 0 | 1 | 0 | 30 |
| 15 | Ignition check | TRUE | FALSE | 6000 | 14 | ch_60 | pu_pos60 | 20 | 0 | 1 | 0 | 30 |
| 16 | STOP check | TRUE | FALSE | 2000 | 14 | ch_60 | pu_pos60 | 14 | 0 | 1 | 0 | 30 |
| 17 | Discharge short | TRUE | FALSE | 0 | 0 | NONE | NONE | 0 | 0 | 0 | 0 | 0 |

FIG. 8

Signal Inspection Device

BACKGROUND OF INVENTION

This invention relates to a signal inspection device for inspection operating function of various electronic devices and more particularly to such a device and a method for testing wherein the operation and inspection device do not require the operation of a personal computer.

Signal inspection devices are used to inspect operational functions of various electronic devices that perform various operations under specified conditions. The signal inspection device is used to judge whether the output of an electronic device is correct by inputting into the electronic device inspection signals commensurate with the use conditions of the electronic device and measuring the output signals produced in response to the input signals.

For this purpose, PC-connected type of signal inspection devices have been conventionally employed. In this method an inspection unit with a electronic device to be tested is placed therein. Then a connection is made to a PC (personal computer) which controls input signals to the electronic device and measures output from the electronic device.

With the PC-connected type of inspection device, measurement and control functions of the inspection are dependent on the performance of the PC. Therefore, stabilized, highly reliable inspection cannot always be made. In addition, the flexibility of such PC-connected type of inspection devices is limited. For example, if a special control is required for each inspection item, for example a temporary stop time control for a very short time, such as in microseconds, before performing measurement, control functions must be set according to the operating system software of the PC. This requires detailed, special knowledge about the operation system of the PC. As a result, considerable time is required before the measurement and control are actually performed. Also with the PC-connected type of inspection device, if an accidental stop of the PC operation due to incorrect operation or failure of the PC further problems arise. To resolve them requires special knowledge of the operating system of the PC. This increases personnel costs, adds to time and trouble of maintenance, and lowers the rate of operation and productivity.

Another type of signal inspection device that has been conventionally in use employs a read only memory (ROM) that cannot be rewritten and in which an inspection program is written from outside the inspection device. The ROM is then mounted on a CPU board (control circuit) of an inspection unit. Inspection signals are inputted according to the inspection program of the ROM and the output signals are detected.

A problem with inspection devices using a ROM is their flexibility is limited because the inspection program cannot be easily rewritten. To rewrite the inspection program of the ROM, requires special knowledge and apparatus.

It is therefore a principal object of this invention to provide a signal inspection device and method where measurement and inspection can be performed without being affected by the performance of a PC. It is a further object of the invention to provide a signal inspection device and method where the inspection program can be easily rewritten without requiring special knowledge of the operating system of a PC. It is a still further object of the invention to provide a signal inspection device and method where changes in the electronic device to be inspected can be easily made.

SUMMARY OF INVENTION

A feature of this invention is embodied in signal inspection device for testing a plurality of electronic devices that receive inputs and output outputs signals in response thereto. The signal inspection device comprising a memory circuit for storing an inspection program adapted to electronic devices to be inspected. The memory circuit is capable of being programmed by an external personal computer. A power supply is provided for applying input signals to an electronic device from the signal inspection device. A display receives and displays output signals from the electronic device being tested in response to the applied input signals.

Another feature of the invention is embodied in a method for testing a plurality of electronic devices that receive inputs and outputs output signals in response thereto. The method comprises the steps of applying an input signal to the tested electronic device from a power supply of a signal inspection device. The signal inspection device comprises a memory circuit for storing an inspection program adapted to the electronic device and capable of being programmed by an external personal computer. Then the output signal from the electronic device being tested in response to the applied input signals is displayed on a display of the signal inspection device.

DETAILED DESCRIPTION

Figure 1:
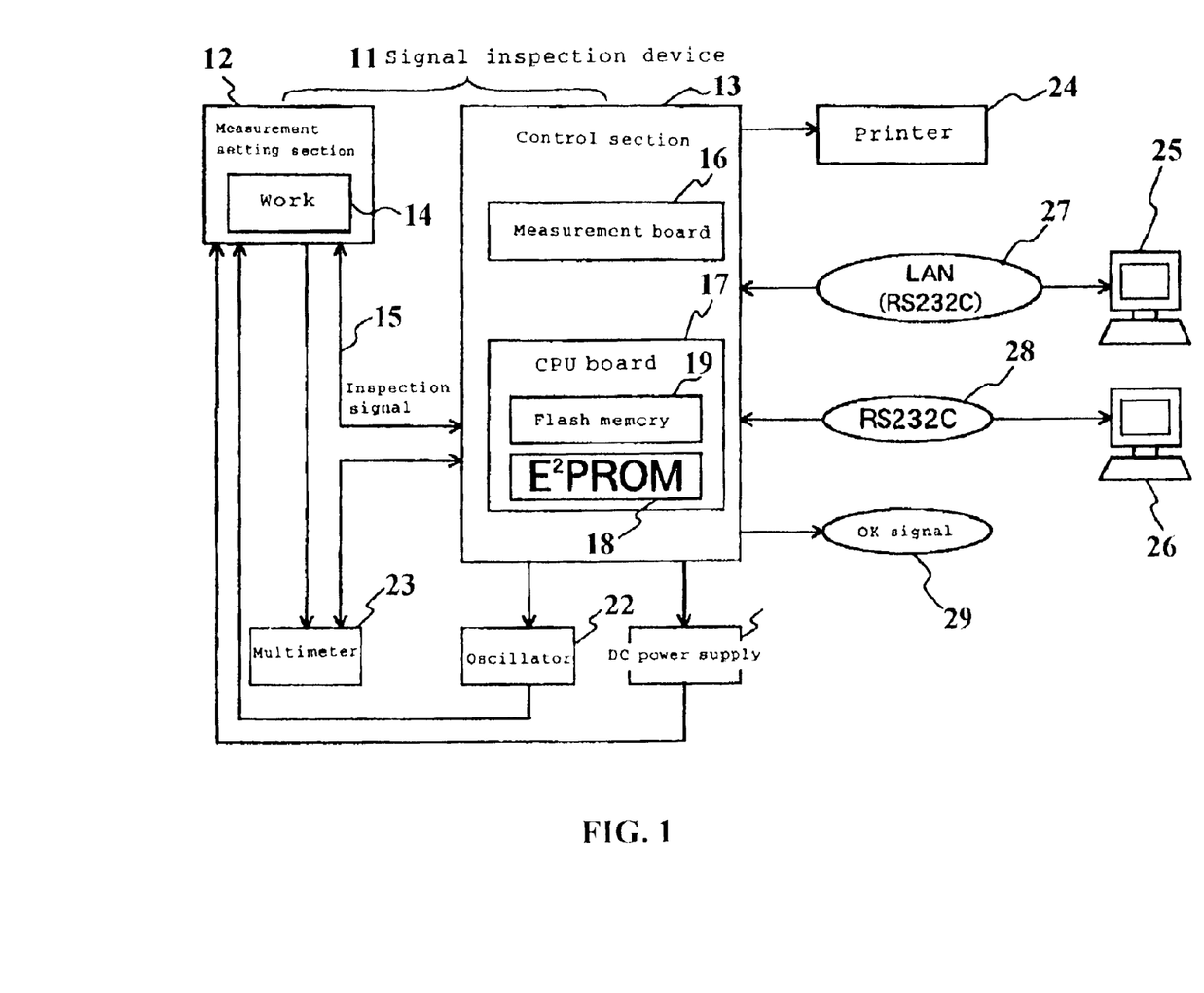
FIG. 1 is a schematic view of a testing apparatus capable of performing a testing method, both in accordance with an embodiment of the invention.

Referring first to FIG. 1, a signal inspection device in accordance with the invention is indicated generally at 11. The signal inspection device 11 comprises a measurement setting section 12 and a control section or inspection unit 13. The measuring setting section 12 is adapted to receive an electronic device (Work) 14 to be inspected.

A signal cable 15 between the measurement setting section 12 and the control section 13 transmits input and output of inspection signals with the electronic device 14. The electronic device 14 may be for example a control circuit board of an ignition timing control unit for an automobile engine.

The control section 13 is provided therein with a measurement board 16 for measuring inspection output from the electronic device 14. A CPU board 17 is also provided therein for controlling input and output control of the inspection signals. The CPU board 17 is provided with an EEPROM 18 in which an inspection program is stored in a manner to be described and with a flash memory 19 in which is stored a device driving program for implementing an inspection process according to the inspection program.

As external measurement devices connected to the control section 13, there are provided; a DC power source 21 for applying a voltage to the electronic device 14, an oscillator 22 for generating pulse signals, and a multimeter 23 for measuring output from the electronic device.

Also externally connected to the control section 13 may be; a printer 24 for printing measurement results, a control-purpose personal computer (PC) 25 for collecting and controlling inspection data, and a programming or debugging PC 26 for setting or changing the inspection program as will be described later. The control purpose PC 25 is connected through a communication network 27 such as a LAN (or a communication line such as an RS232C). The programming-purpose PC 26 is connected through a communication line 28 such as an RS232C. An OK or NG signal is outputted from the control section 13 through a line to a display 29 if the inspection results are normal. Based on the OK signals, production control is performed including the steps of counting normal products and impressing normal stamps.

To perform inspection, inspection signals such as voltage, amperage, pulse signals, etc. are inputted to the electronic device 14 in predetermined sequence according to inspection conditions. These constitute, for example, as inspection items and their preset values preset in the inspection program. Of those inspection input signals, those within the range that can be supplied from an inspection-purpose signal generation circuit (not shown) provided within the control section 13 are provided directly by it. The inspection-purpose signal generation circuit comprises a power source circuit, a timer circuit, and a waveform output circuit. These signals are applied through the signal cable 15 to the electronic device 14 placed in the measurement setting section 12. High voltage signals such as the inspection-purpose voltage that cannot be supplied from the circuit within the control section 13 are supplied from the external DC power source 21 or the oscillator 22 to the measurement setting section 12 according to control commands given by the control section 13.

Output signals generated by these inputs by the electronic device 14 are transmitted through the signal cable 15 to the measurement board 16 in the control section 13 and measured with the measurement board 16. Signals that cannot be measured with the measurement board 16 are transmitted to the multimeter 23 and measured there. The results of measurement with the multimeter 23 are transmitted to the control section 13. It is also possible to transmit output signals from the electronic device 14 directly to the multimeter 23 and measure there. The measurement results are checked in the control section 13 whether or not they are within an appropriate range, and displayed as OK or NG at 29.

This inspection process is performed according to the inspection program stored in the EEPROM 18, a rewritable memory circuit, mounted on the CPU board 17 of the control section 13. Therefore, the control-purpose, external PC 25 and the programming purpose PC 26 are not used for inspection control, and the inspection is performed independently with the control section 13 in accordance with the invention.

Figure 2:
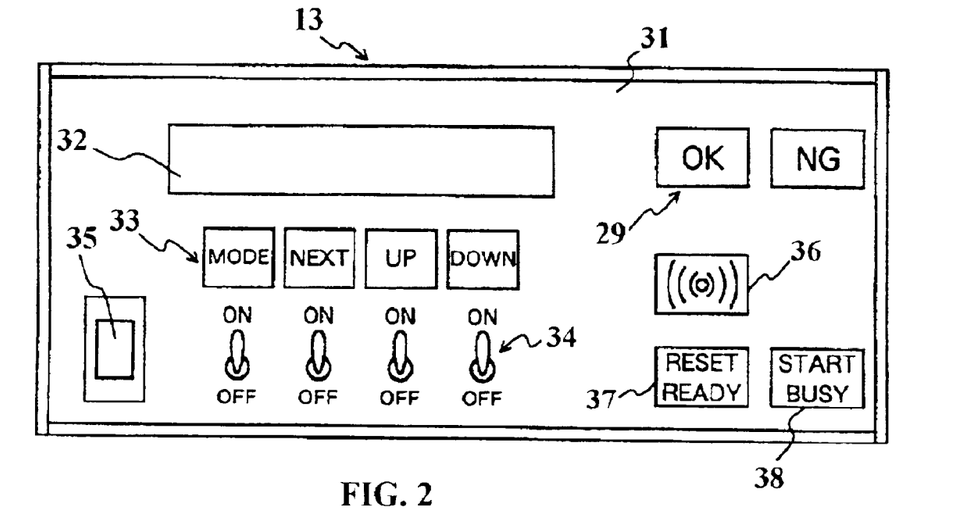
FIG. 2 is a front elevational view of the inspection unit constructed in accordance with an embodiment of the invention.
Figure 3:
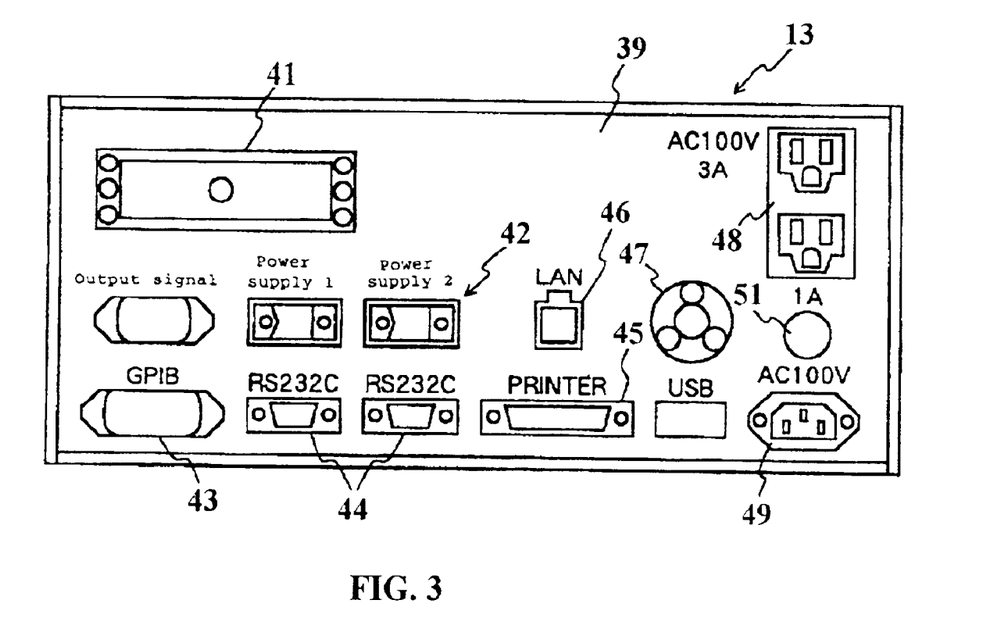
FIG. 3 is a rear elevational view of the inspection unit.
Figure 4:
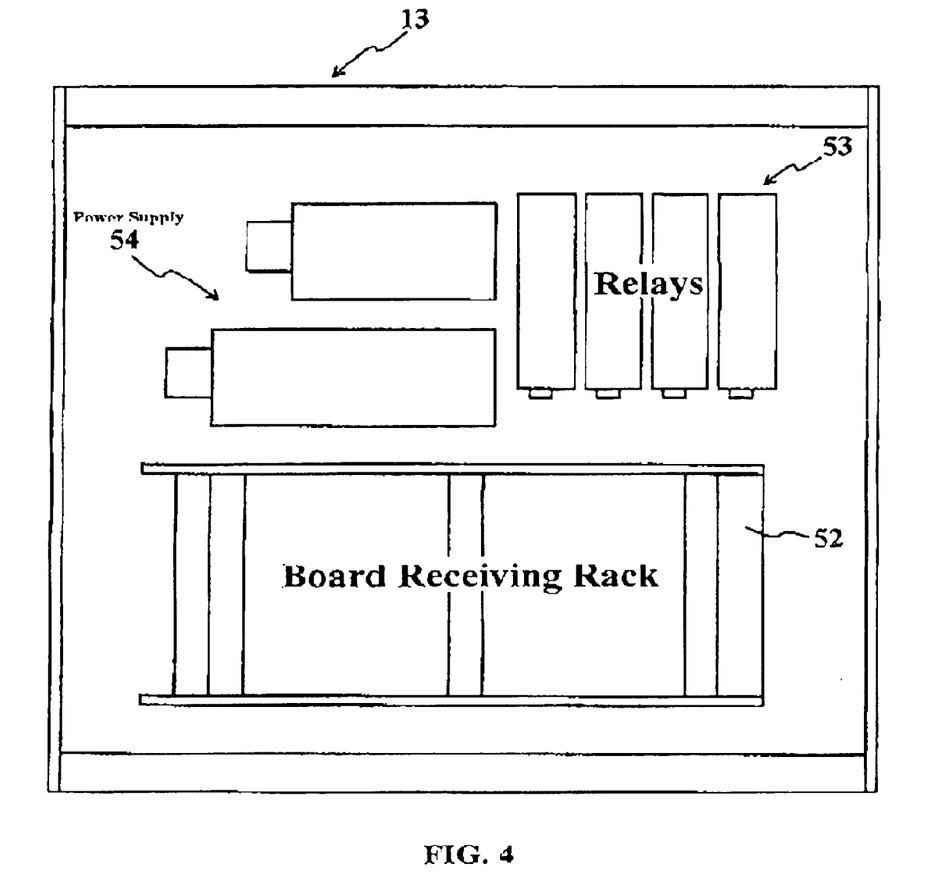
FIG. 4 is a top plan view of the interior of the inspection unit.

FIGS. 2, 3, and 4 show external structure of the control section 13. As seen in FIG. 2, on a front panel 31 of the control section 13 are arranged; a monitor screen 32 for displaying inspection information, a series 33 of display operation buttons for controlling choice and movement of the displayed images, and a series 34 of switches for changing operation mode and inspection mode of the inspection unit 11. Additionally provided on the front panel 31 are a power source switch 35, the display 29 for indicating judgment result, whether the inspection result is normal (OK) or unacceptable (NG) and a buzzer 36 for producing sound in response to the judgment result. Finally the front panel 31 mounts a reset button 37 for indicating the state of reset or standby, and a start button 38 for indicating that the inspection is started or in process.

Turning now to FIG. 3, the rear panel 39 supports a signal cable connector 41 for connection to the measurement setting section 12 (FIG. 1), a pair of external power source terminals 42, a GPIB communication terminal 43, two RS232C communication terminals 44, a printer connection terminal 45, a LAN connection terminal 46, and a multimeter connection terminal 47. Finally, the rear panel 39 mounts AC 100 V outlets 48 and 49 and a fuse 51.

As seen in FIG. 4, arranged in the interior of the control section 13 is a board rack 52 for installing inspection-purpose circuit boards (not shown) such as the measurement board 16 (FIG. 1) and the CPU board 17 (FIG. 1). The interior of the control section 13 also contains a plurality 53 of relays for applying appropriate voltages to the electronic device 14 (FIG. 1), and an internal power source 54 for circuits in the inspection unit 13.

Figure 5:
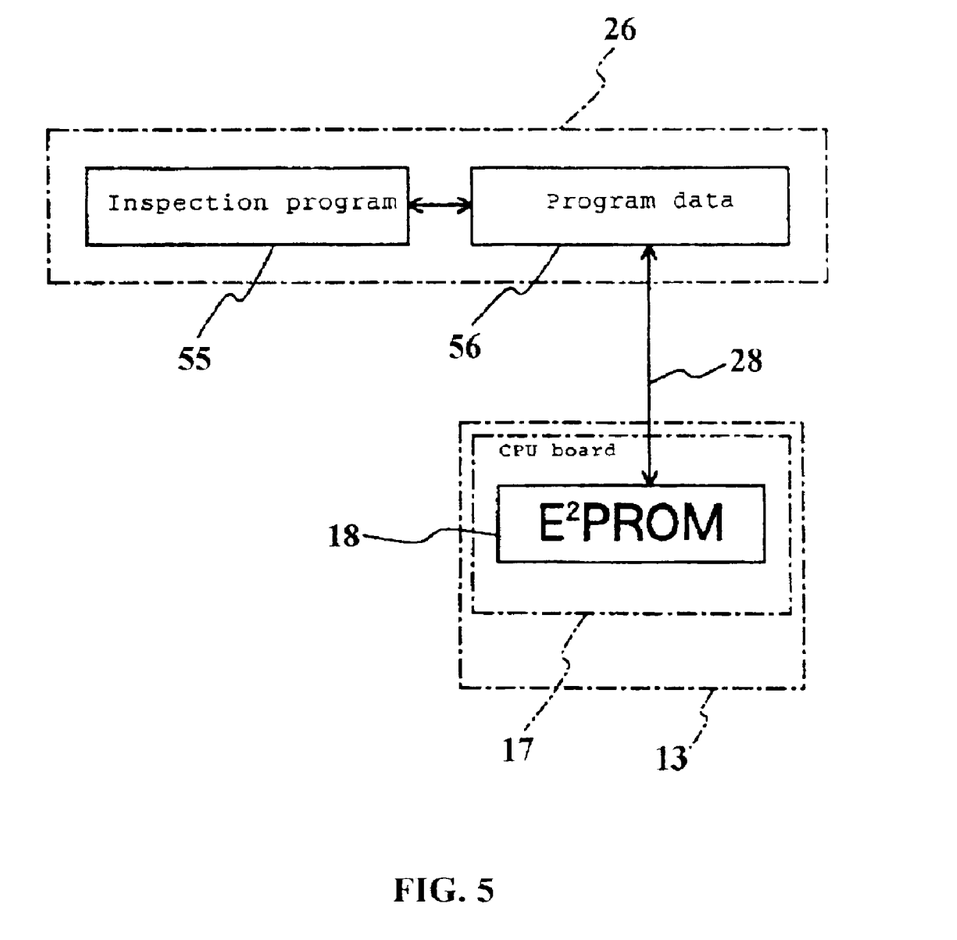
FIG. 5 is a diagrammatic view for explaining the inspection program creation procedure according to the invention.

Referring now to FIG. 5, this figure is utilized to facilitate the explanation of the method of making an inspection program according to the invention. It basically shows the interrelationship between the control section 13 and the programming or debugging PC 26. To create the inspection program, an inspection program 55 of dialogue type is displayed on the screen of the PC 26 to set inspection conditions. The inspection program 55 is prearranged in a format to show a table of inspection items to be chosen, with each inspection item provided with a format for setting details. The inspection program formatted in this way may be newly created on the basis of software stored in the PC 26. Alternatively, it is possible to read out, through the communication line 28 interconnecting the control section 13 and the PC 26, the inspection program data stored in the EEPROM 18 of the CPU board 17 provided in the control section 13. From this it is possible to write new data into the inspection program data or rewrite inspection data that are already written in.

The program data, represented at 56, such as inspection items and their setting values written by the table choice method on the interactive type of image on the screen of the PC 26 are automatically stored as an intermediate file. The program data 56 of the intermediate file are transmitted through the communication line 28 to the control section 13 and stored as an inspection program in the EEPROM 18 of the CPU board 17. That is, the inspection program 55 in the form of program data 56 of the intermediate file is transferred between the PC 26 and the control section 13 of the inspection device 11. Using the software on the PC side, a dialogue type of image is displayed and program data are set to create (change) the inspection program.

Figure 6:
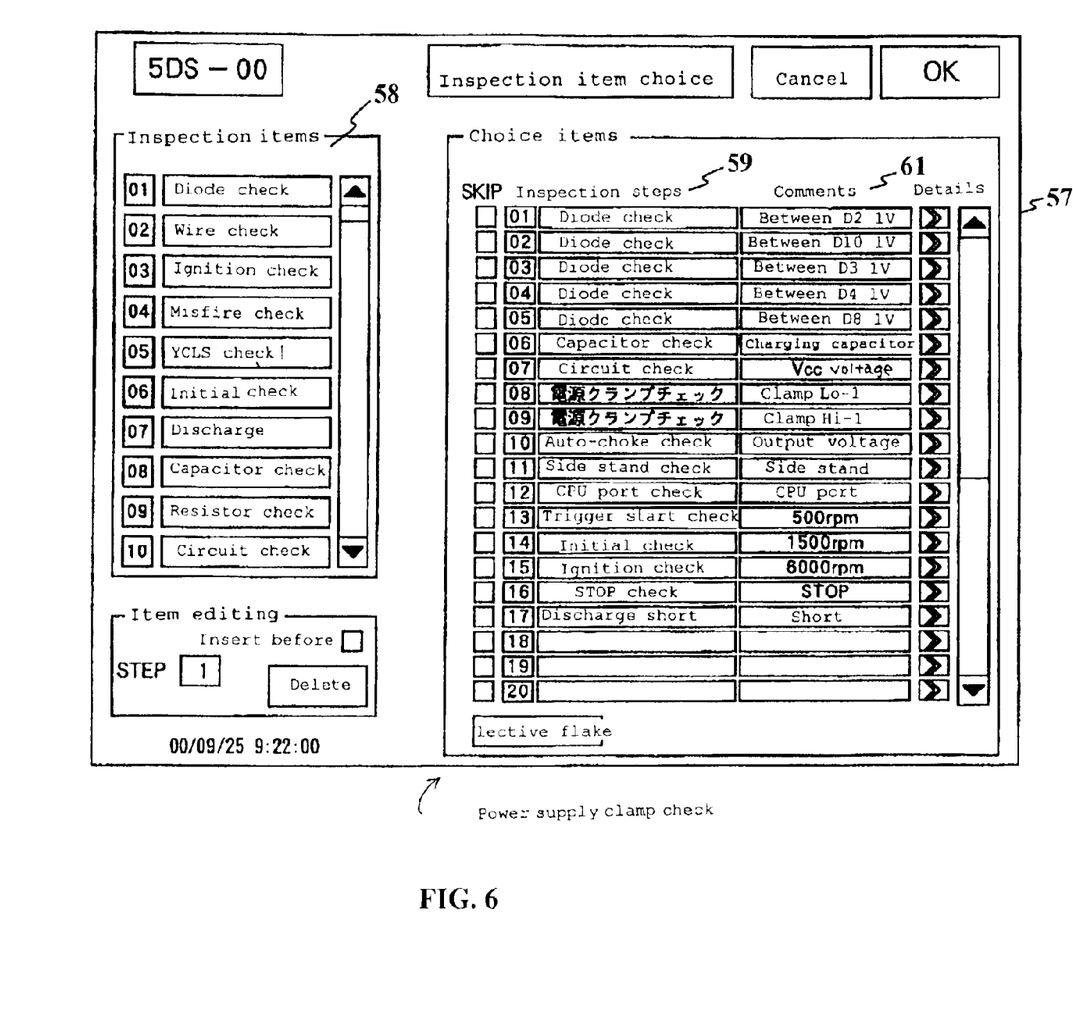
FIG. 6 is view showing the interactive type of display for setting inspection items of the inspection program according to the invention.
Figure 7:
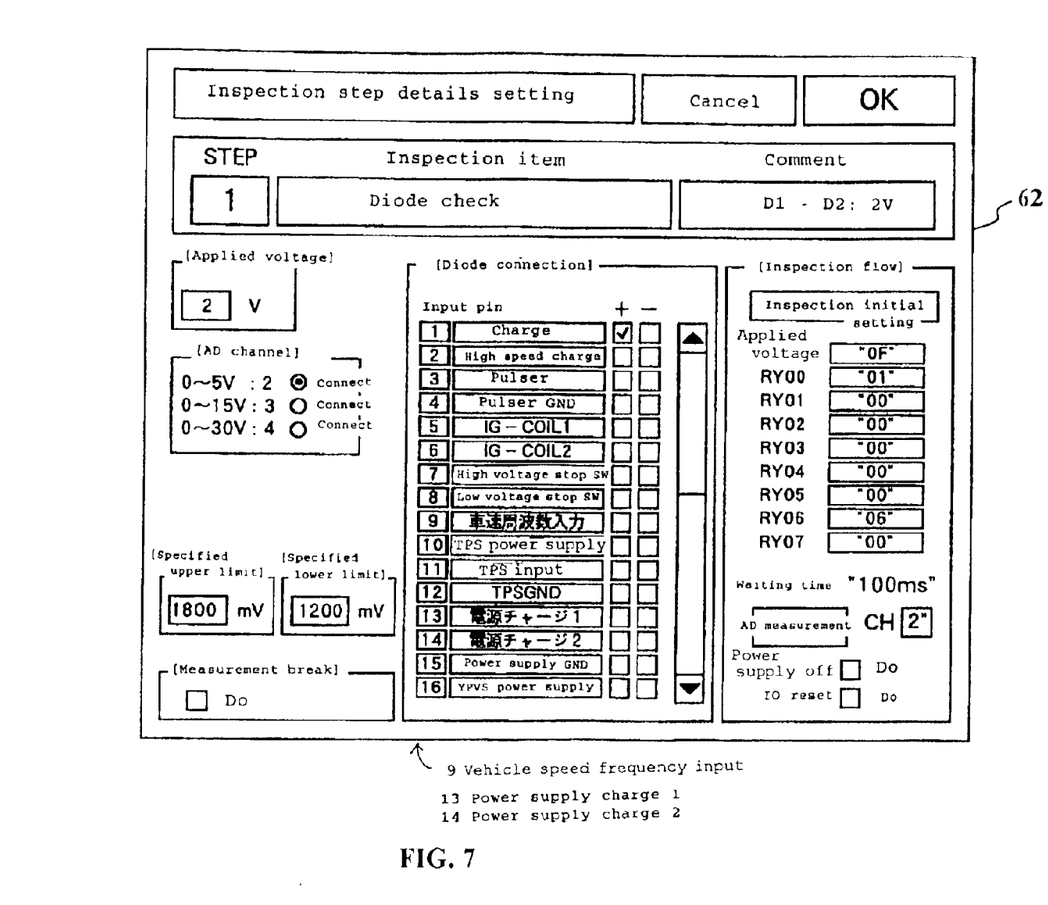
FIG. 7 is view in part to FIG. 6 of the display image of specifying details of the inspection items shown in FIG. 6.
Figure 8:
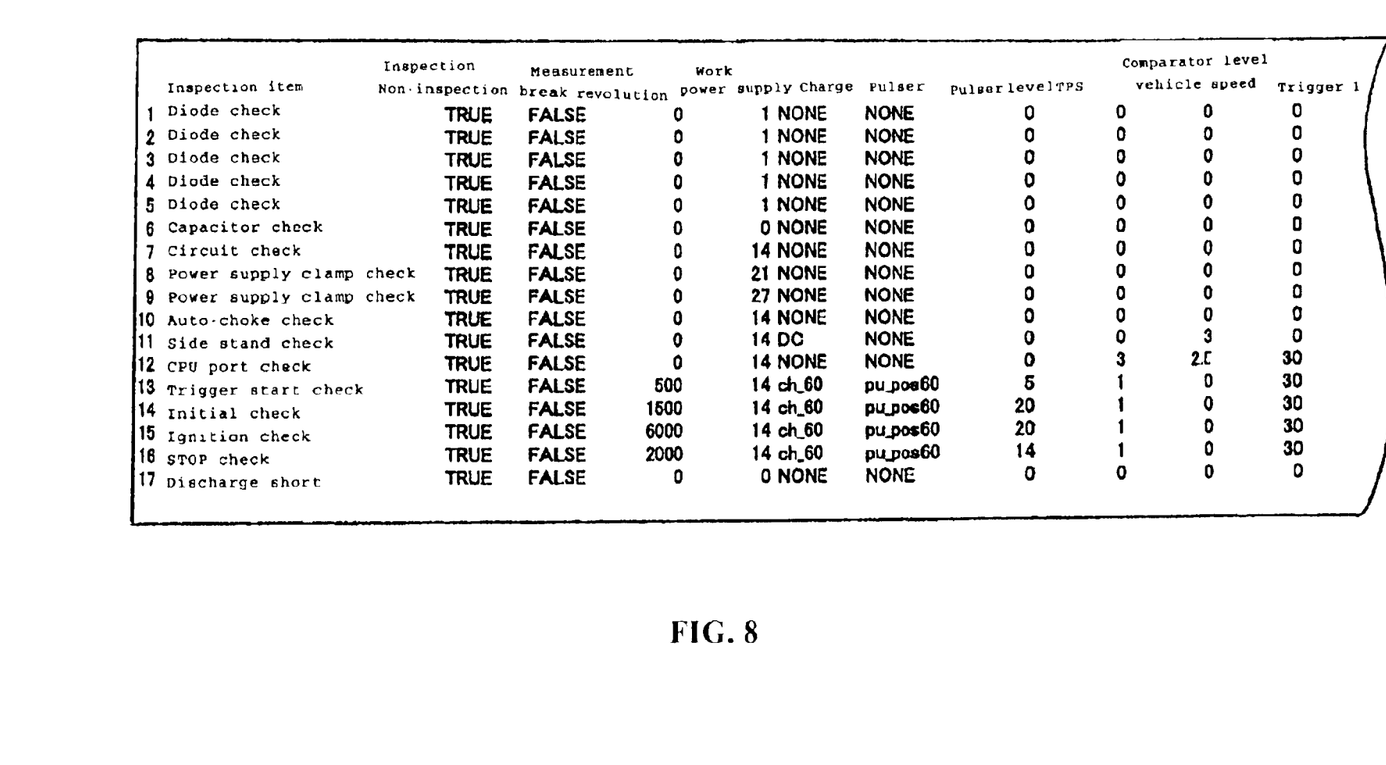
FIG. 8 is a view of an example of an intermediate file of program data.

FIGS. 6 and 7 illustrate specific examples of dialogue type of pictures for setting inspection program data 56. FIG. 6 illustrates setting inspection items. FIG. 7 illustrates setting the details of the inspection items. FIG. 8 illustrates part of an intermediate file of the program data set. In this specific example, the electronic device 16 to be inspected is an ignition timing control unit of an automobile.

As shown in FIG. 6, a display image 57 shows a table of multiple inspection items in an inspection items box 58. The multiple inspection steps are specified in sequence on the inspection step box 59 with simple commentson the inspection points being displayed at 61.

As shown in FIG. 7, detailed inspection conditions of each of the inspection items specified in the above FIG. 6 are shown on the dialogue type of display image 62.

The program data such as the inspection items and the inspection conditions specified as described above are grouped for respective inspection items as inspection parameters necessary for the inspection process into intermediate file data and temporarily stored in the PC. The intermediate file data as illustrated in FIG. 8 are sent to and stored in the EEPROM 18 on the inspection device side.

As should be apparent from the foregoing description of a preferred embodiment, the inspection process is performed not by the operation of a PC but within the inspection device itself according to the inspection program stored in the memory circuit in the inspection device. Therefore, the inspection is performed without being affected by the performance of the PC with constant stability and reliability. Furthermore, since the program data which specifies the inspection conditions constituting inspection program may be read with an external PC connected to the inspection device and also may be rewritten, the reading may be done out of the memory circuit of the inspection device without requiring special knowledge of the device for the rewriting process, and it is possible to cope with the changes in the electronic device; efficiently, simply, quickly, and accurately.

For setting inspection conditions, an interactive type of display screen is modularized to prepare as a standard form of library, the inspection conditions are specified on the interactive type of display screen when the program data are rewritten, so that the program data are created more easily and accurately. In that case, as the data transmission between the PC and the inspection device is performed using an intermediate program data file organized with inspection items and inspection conditions, the transmission is performed easily and securely, and the memory area size is saved. Increasing the number of libraries makes it possible to easily increase the inspection conditions and inspection items, so that the range of inspection subjects may be widened.

Of course, the foregoing description is that of a preferred embodiment of the invention and various changes and modifications may be made without departing from the spirit and scope of the invention, as defined by the appended claims.

What is claimed is:

1. A signal inspection device for testing any of a plurality of electronic devices that receive inputs and output outputs signals in response thereto, said signal inspection device comprising a memory circuit comprised of an EEPROM for storing an inspection program adapted to electronic devices to be inspected, said memory circuit being capable of being programmed by a personal computer external to said signal inspection device and detachably connectable thereto for programming said memory circuit to suit the electronic device to be tested, a power supply for applying input signals to an electronic device detachably connected to said signal inspection device from said signal inspection device, and a display for receiving and displaying output signals from the electronic device being tested in response to the applied input signals and created as an interactive type of displayed image on said external personal computer and transferred therefrom to said memory circuit.

2. A signal inspection device as set forth in claim 1, wherein the display is driven solely by the signal inspection device and operates independently of any personal computer.

* * * * *